(12) United States Patent
Machida

(10) Patent No.: US 7,628,824 B2
(45) Date of Patent: Dec. 8, 2009

(54) SUBSTRATE PROCESSING APPARATUS FOR PROCESSING PLURALITY OF SUBSTRATES IN SUCCESSION

(75) Inventor: Eisaku Machida, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 78 days.

(21) Appl. No.: 12/046,641

(22) Filed: Mar. 12, 2008

(65) Prior Publication Data
US 2008/0235926 A1    Oct. 2, 2008

(30) Foreign Application Priority Data
Mar. 30, 2007   (JP)   ............................. 2007-091635

(51) Int. Cl.
*H01L 21/00*   (2006.01)

(52) U.S. Cl. ...................... 29/25.01; 118/719; 118/696; 118/702; 156/345.32

(58) Field of Classification Search ................. 118/696, 118/702, 703, 719; 156/345.24, 345.31, 156/345.32; 414/222.01, 222.07, 222.1, 414/222.12, 935, 939
See application file for complete search history.

(56) References Cited

U.S. PATENT DOCUMENTS 5,562,387 A    10/1996   Ishii et al.

2006/0137726 A1*   6/2006   Sano et al. ..................... 134/61
2009/0014126 A1*   1/2009   Ohtani et al. .......... 156/345.24

FOREIGN PATENT DOCUMENTS

| JP | 07-106402 | 4/1995 |
| JP | 2005-93653 | 4/2005 |

* cited by examiner

Primary Examiner—Richard A. Booth
(74) Attorney, Agent, or Firm—Ostrolenk Faber LLP (57) ABSTRACT

An indexer robot includes two transport arms. The indexer robot simultaneously transports two unprocessed substrates from a cassette to a substrate transfer part in such a manner that each of the two transport arms holds a single unprocessed substrate. Also, the indexer robot simultaneously receives two processed substrates from the substrate transfer part and simultaneously transports the two processed substrate to a cassette in such a manner that each of the two transport arms holds a single processed substrate. The provision of three sending substrate rest parts and three returning substrate rest parts in the substrate transfer part enables the indexer robot to smoothly accomplish the simultaneous two-substrate transport, thereby reducing the time required for the transport of substrates in an entire substrate processing apparatus.

6 Claims, 7 Drawing Sheets

| Step | 1 | 2 | 3 | 4 | 5 | 6 | 7 | 8 | 9 | 10 | 11 | 12 | 13 |
|------|---|---|---|---|---|---|---|---|---|----|----|----|----|
| SPASS1 | 2 |   | 6 |   | 10 |   | 14 |   | 18 |    | 22 |    | 25 |
| SPASS2 | 1 | 3 | 5 | 7 | 9 | 11 | 13 | 15 | 17 | 19 | 21 | 23 |    |
| SPASS3 |   | 4 |   | 8 |   | 12 |   | 16 |    | 20 |    | 24 |    |

FIG. 6

| Step | 1 | 2 | 3 | 4 | 5 | 6 | 7 | 8 | 9 | 10 | 11 | 12 | 13 |
|---|---|---|---|---|---|---|---|---|---|---|---|---|---|
| SPASS1 | ①—② | | ⑤—⑥ | | ⑨—⑩ | | ⑬—⑭ | | ⑰—⑱ | | ㉑—㉒ | | ㉕ |
| SPASS2 | | | | | | | | | | | | | |
| SPASS3 | | ③—④ | | ⑦—⑧ | | ⑪—⑫ | | ⑮—⑯ | | ⑲—⑳ | | ㉓—㉔ | |
| SPASS4 | | | | | | | | | | | | | |

FIG. 7

| Step | 1 | 2 | 3 | 4 | 5 | 6 | 7 | 8 | 9 |
|---|---|---|---|---|---|---|---|---|---|
| SPASS1 | 3 |   | 9 |   | 15 |   | 21 |   | 25 |
| SPASS2 | 2 | 4 | 8 | 10 | 14 | 16 | 20 | 22 |   |
| SPASS3 | 1 | 5 | 7 | 11 | 13 | 17 | 19 | 23 |   |
| SPASS4 |   | 6 |   | 12 |   | 18 |   | 24 |   |

FIG. 8

| Step | 1 | 2 | 3 | 4 | 5 | 6 | 7 | 8 | 9 |
|---|---|---|---|---|---|---|---|---|---|
| SPASS1 | 3 |   | 9 |   | 15 |   | 21 |   | 25 |
| SPASS2 | 2 |   | 8 |   | 14 |   | 20 |   |   |
| SPASS3 | 1 | 4 | 7 | 10 | 13 | 16 | 19 | 22 |   |
| SPASS4 |   | 5 |   | 11 |   | 17 |   | 23 |   |
| SPASS5 |   | 6 |   | 12 |   | 18 |   | 24 |   |

SUBSTRATE PROCESSING APPARATUS FOR PROCESSING PLURALITY OF SUBSTRATES IN SUCCESSION

BACKGROUND OF THE INVENTION

1. Field of the Invention

The present invention relates to a substrate processing apparatus which processes a plurality of substrates such as semiconductor substrates, glass substrates for liquid crystal display devices, glass substrates for photomasks, substrates for optical disks and the like in succession.

2. Description of the Background Art

As is well known, semiconductor and liquid crystal display products and the like are fabricated by performing a series of processes including cleaning, resist coating, exposure, development, etching, interlayer insulation film formation, heat treatment, dicing and the like on the above-mentioned substrates. In general, a substrate processing apparatus is constructed by incorporating processing units which perform these various processes and transport robots which transport substrates to the processing units in the substrate processing apparatus. An apparatus which incorporates a resist coating unit for performing a resist coating process on a substrate, a development processing unit for performing a development process on a substrate, and a transport robot for transporting a substrate between the coating processing unit and the development processing unit is widely used as a so-called coater-and-developer.

As an example of such substrate processing apparatuses, a coater-and-developer in which a plurality of cells each composed of a single transport robot and a plurality of processing units to and from which the single transport robot transports substrates are provided in juxtaposition and a substrate transfer part is provided between the cells to transfer substrates between the transport robots of adjacent ones of the cells is disclosed, for example, in Japanese Patent Application Laid-Open No. 2005-93653.

The apparatus disclosed in Japanese Patent Application Laid-Open No. 2005-93653 is an apparatus for performing the resist coating process and the development process on substrates. It is, however, conceivable that a structure which connects a plurality of cells through a substrate transfer part in a manner similar to the disclosed apparatus is applied to an apparatus which performs other types of processes, e.g., a cleaning processing apparatus which uses a brush to clean a substrate. Specifically, the cleaning processing apparatus is constructed by connecting an indexer cell which accumulates unprocessed substrates and processed substrates therein and a cleaning processing cell provided with a brush cleaning unit to each other through the substrate transfer part. Each of the indexer cell and the cleaning processing cell is provided with a transport robot exclusive to each cell.

As compared with the coater-and-developer as disclosed in Japanese Patent Application Laid-Open No. 2005-93653, however, the cleaning processing apparatus has short cycle time so that an unprocessed substrate transferred from the indexer cell to the cleaning processing cell is subjected to the cleaning process and returned to the indexer block for a very short period of time. Thus, the entire throughput of the cleaning processing apparatus is often determined by processing time in the indexer.

For the purpose of improving the throughput, it is hence necessary to increase the processing speed of the indexer cell. Specifically, it is conceivable to increase the operating speed of a transport mechanism in the indexer cell. However, only the increase in the operating speed of the transport mechanism causes a problem such that it is difficult to transport substrates with stability at an excessively high speed.

SUMMARY OF THE INVENTION

The present invention is intended for a substrate processing apparatus for processing a plurality of substrates in succession.

According to the present invention, the substrate processing apparatus comprises: a substrate accumulation part for accumulating unprocessed substrates and processed substrates; a substrate processing part for performing a process on a substrate; a substrate transfer part used for transfer of a substrate between the substrate accumulation part and the substrate processing part; a first transport mechanism including N transport arms (where N is an integer not less than two) and for transporting a substrate between the substrate accumulation part and the substrate transfer part; a second transport mechanism for transporting a substrate between the substrate transfer part and the substrate processing part; and a transport controller for controlling the first transport mechanism to take an unprocessed substrate from the substrate accumulation part to transport the unprocessed substrate to the substrate transfer part, and to receive a processed substrate placed on the substrate transfer part to transport the processed substrate to the substrate accumulation part, the transport controller controlling the first transport mechanism so that the first transport mechanism simultaneously transports N unprocessed substrates from the substrate accumulation part and simultaneously loads the N unprocessed substrates into the substrate transfer part in such a manner that each of the N transport arms holds a single unprocessed substrate, the substrate transfer part including at least (N+1) sending substrate rest parts each for placing thereon an unprocessed substrate traveling from the substrate accumulation part toward the substrate processing part.

This reduce the time required for the transport per substrate to thereby reduce the time required for the transport of substrates in the entire substrate processing apparatus.

Preferably, the at least (N+1) sending substrate rest parts are arranged in a single direction in an array. When there is an overlapping substrate rest part which is an overlap between the N of the at least (N+1) sending substrate rest parts as reckoned from a first end of the array and the N of the at least (N+1) sending substrate rest parts as reckoned from a second end of the array, the transport controller controls the first transport mechanism so that the first transport mechanism which transports N unprocessed substrates loads the earliest one of the N unprocessed substrates to be processed preferentially onto the overlapping substrate rest part.

This smoothly accomplishes the subsequent step of simultaneous N-substrate transport to thereby reduce the time required for the transport of substrates in the entire substrate processing apparatus.

Preferably, when the overlapping substrate rest part is present and the first transport mechanism transports a single unprocessed substrate alone, the transport controller controls the first transport mechanism to load the single unprocessed substrate onto other than the overlapping substrate rest part in the substrate transfer part.

This smoothly accomplishes the subsequent step of simultaneous N-substrate transport to thereby reduce the time required for the transport of substrates in the entire substrate processing apparatus.

It is therefore an object of the present invention to provide a substrate processing apparatus capable of reducing the time required for the transport of substrates in the entire substrate processing apparatus.

These and other objects, features, aspects and advantages of the present invention will become more apparent from the following detailed description of the present invention when taken in conjunction with the accompanying drawings.

DESCRIPTION OF THE PREFERRED EMBODIMENTS

Preferred embodiments according to the present invention will now be described in detail with reference to the drawings.

1. First Preferred Embodiment

Figure 1:
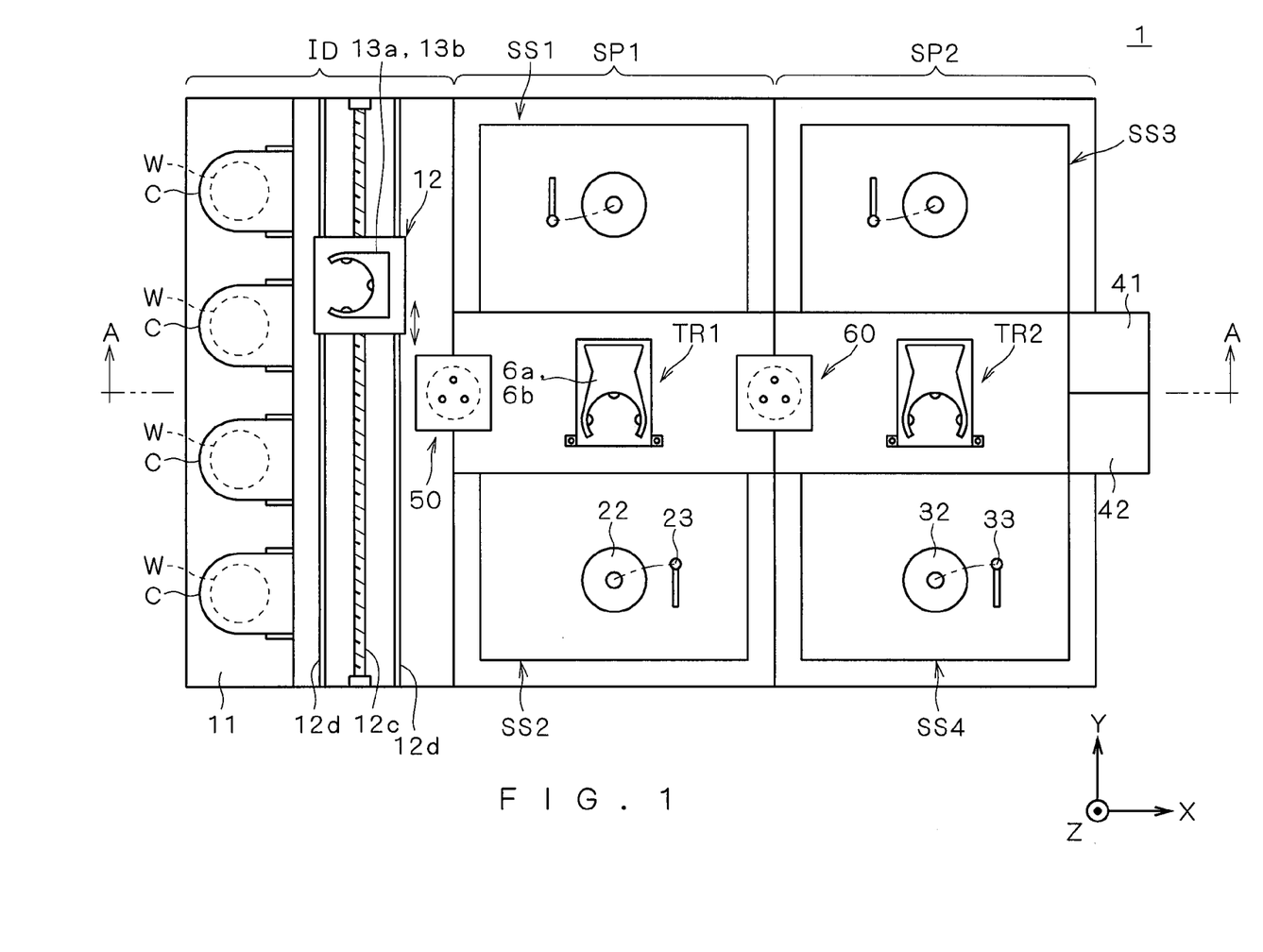
FIG. 1 is a plan view of a substrate processing apparatus according to the present invention.
Figure 2:
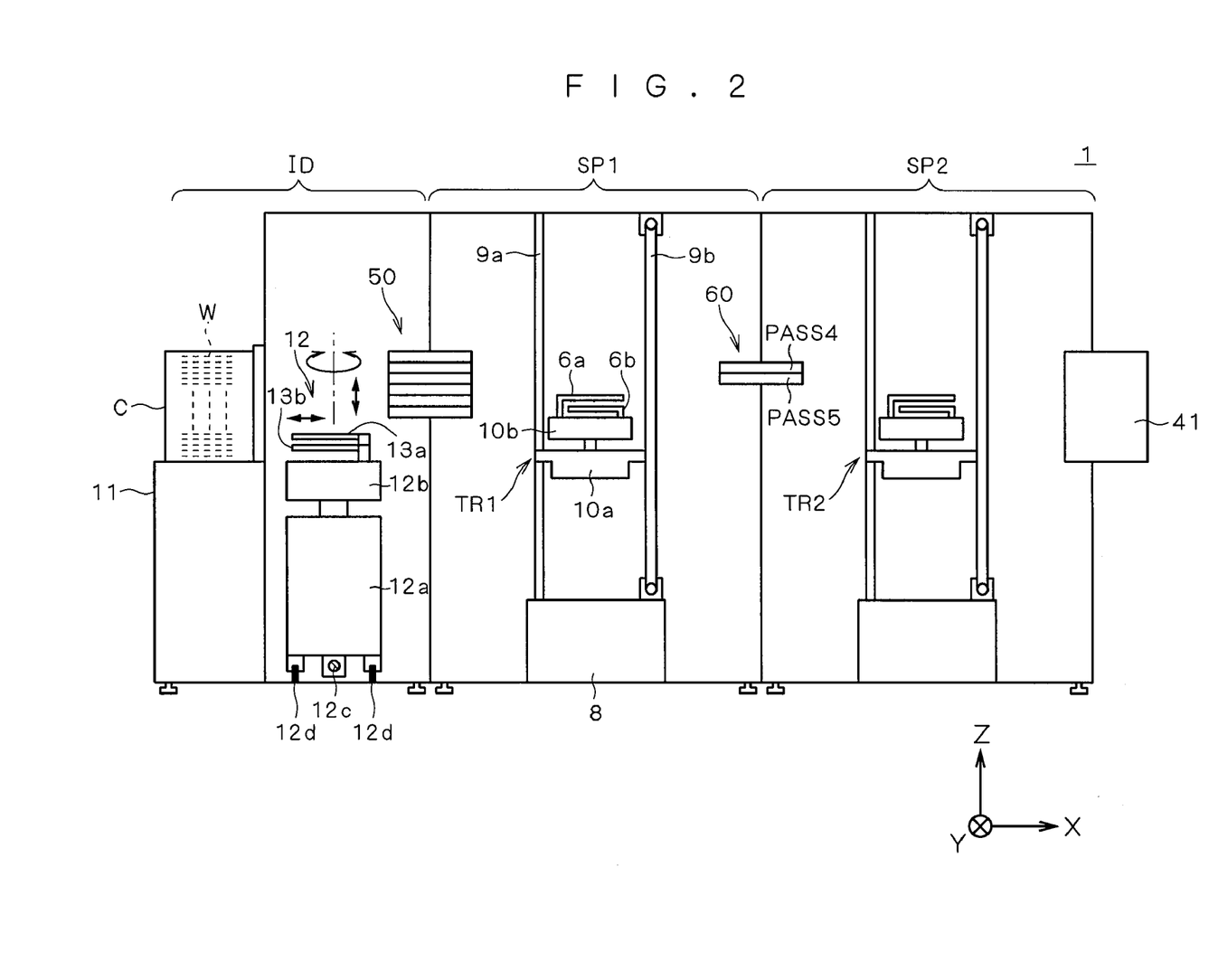
FIG. 2 is a view of the substrate processing apparatus taken along the line A-A of FIG. 1.

FIG. 1 is a plan view of a substrate processing apparatus 1 according to the present invention. FIG. 2 is a view taken along the line A-A of FIG. 1. An XYZ rectangular coordinate system in which an XY plane is defined as the horizontal plane and a Z axis is defined to extend in the vertical direction is additionally shown in FIG. 1 and subsequent figures for purposes of clarifying the directional relationship therebetween. The substrate processing apparatus 1 is a cleaning apparatus for performing a scrub cleaning process on a plurality of substrates such as semiconductor wafers in succession, and includes three cells: an indexer cell ID, a first cleaning processing cell SP1 and a second cleaning processing cell SP2, which are provided in juxtaposition.

The indexer cell ID is a cell for transferring unprocessed substrates received from the outside of the substrate processing apparatus 1 outwardly to the first cleaning processing cell SP1 and the second cleaning processing cell SP2, and for unloading processed substrates received from the cleaning processing cells SP1 and SP2 out of the substrate processing apparatus 1. The indexer cell ID includes a cassette stage 11 for placing thereon a plurality of (in this preferred embodiment, four) cassettes (or carriers) C arranged in juxtaposition in a direction of the Y axis, and an indexer robot 12 for taking unprocessed substrates W from and storing processed substrates W into each of the cassettes C.

An AGV (automatic guided vehicle) or the like loads a cassette C with unprocessed substrates W stored therein from the outside of the substrate processing apparatus 1 onto the cassette stage 11 to place the cassette C on the cassette stage 11. Substrates W subjected to the scrub cleaning process in the substrate processing apparatus 1 are stored again in a cassette C placed on the cassette stage 11. The AGV or the like unloads the cassette C with the processed substrates W stored therein out of the substrate processing apparatus 1. That is, the cassette stage 11 functions as a substrate accumulation part for accumulating unprocessed substrates W and processed substrates W. The cassettes C may be of the following types: an SMIF (standard mechanical interface) pod, and an OC (open cassette) which exposes stored substrates W to the atmosphere, in addition to a FOUP (front opening unified pod) which stores substrates W in an enclosed or sealed space.

The indexer robot 12 according to the first preferred embodiment includes a pair of transport arms 13a and 13b, an arm stage 12b for mounting the pair of transport arms 13a and 13b thereon, and a movable base 12a. The movable base 12a is in threaded engagement with a ball screw 12c extending in parallel with the cassette stage 11 (in a direction of the Y axis), and is provided slidably relative to a pair of guide rails 12d. Thus, as a rotary motor not shown rotates the ball screw 12c, the entire indexer robot 12 including the movable base 12a moves horizontally in a direction of the Y axis.

The arm stage 12b is mounted on the movable base 12a. The movable base 12a incorporates a motor (not shown) for driving the arm stage 12b to pivot about an axis extending in a vertical direction (or in a direction of the Z axis), and a motor (not shown) for moving the arm stage 12b upwardly and downwardly in a vertical direction. The above-mentioned pair of transport arms 13a and 13b disposed vertically at a predetermined spacing are provided on the arm stage 12b. As shown in FIG. 1, each of the transport arms 13a and 13b includes a distal end portion of a substantially C-shaped plan configuration, and a plurality of pins projecting inwardly from the inside of the substantially C-shaped distal end portion support the peripheral edge of a substrate W from below, whereby each of the pair of transport arms 13a and 13b is capable of holding a single substrate W. Each of the transport arms 13a and 13b is independently movable back and forth in a horizontal direction (in the direction of the pivot radius of the arm stage 12b) by a sliding drive mechanism (not shown) mounted in the arm stage 12b.

With such an arrangement, the transport arms 13a and 13b are movable horizontally in a direction of the Y axis, movable upwardly and downwardly, pivotable in a horizontal plane, and movable back and forth in the direction of the pivot radius. The indexer robot 12 causes each of the pair of transport arms 13a and 13b to gain access to each of the cassettes C placed on the cassette stage 11 and each substrate rest part of a substrate transfer part 50 to be described later, thereby transporting substrates W between the cassette stage 11 and the substrate transfer part 50.

The first cleaning processing cell SP1 is provided in adjacent relation to the indexer cell ID. A partition for closing off the communication of atmosphere is provided between the indexer cell ID and the first cleaning processing cell SP1. The substrate transfer part 50 is provided to extend through the partition. That is, the substrate transfer part 50 is provided at an connecting portion of the indexer cell ID and the first cleaning processing cell SP1, and is present between the indexer cell ID and the first cleaning processing cell SP1 for the transfer of substrates W therebetween.

Figure 3:
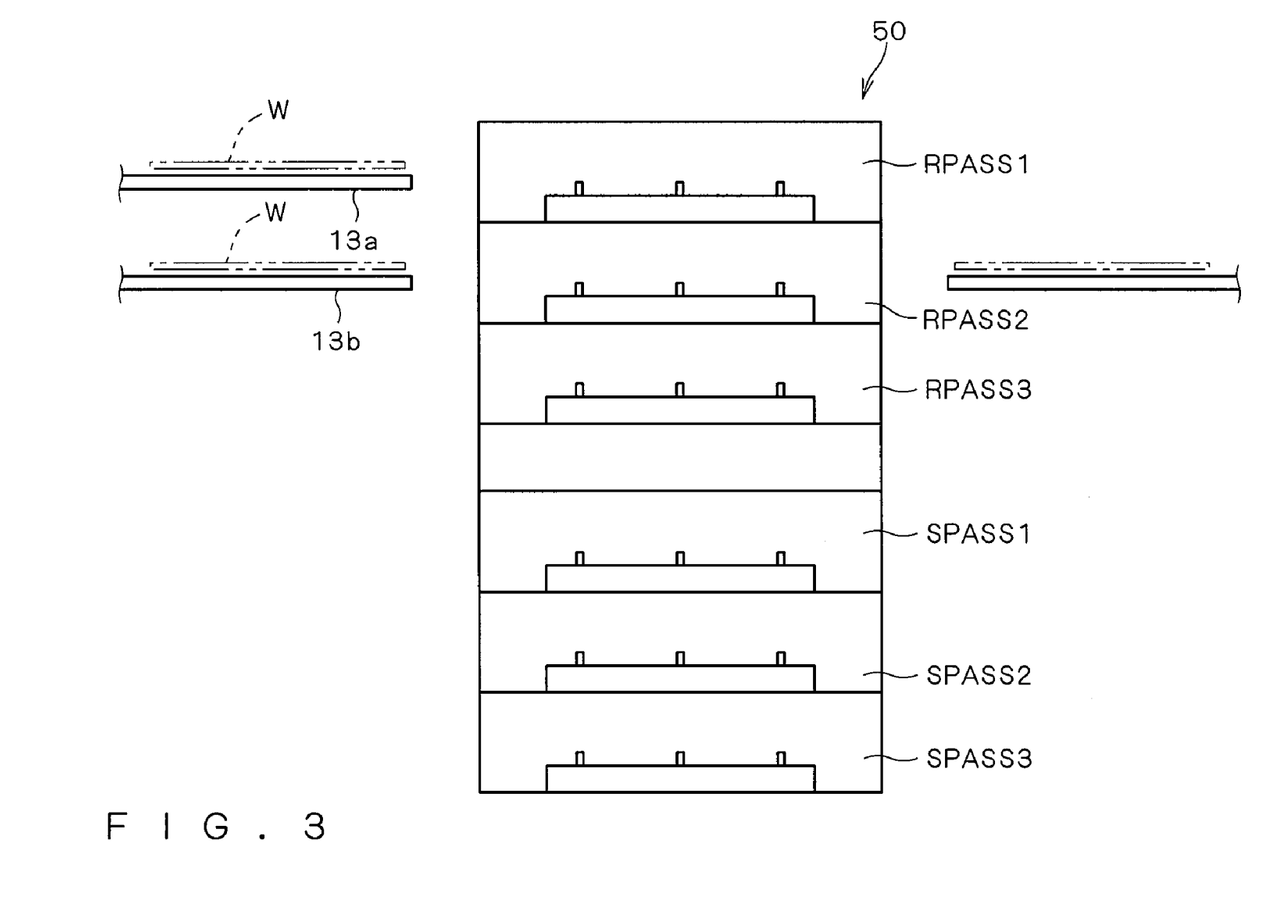
FIG. 3 is a view showing the construction of a substrate transfer part.

FIG. 3 is a view showing the construction of the substrate transfer part 50. The substrate transfer part 50 according to the first preferred embodiment includes six substrate rest parts arranged in vertically stacked relation. Of the six substrate rest parts, three upper substrate rest parts are returning substrate rest parts RPASS1 to RPASS3 for the transfer of processed substrates W from the first cleaning processing cell SP1 to the indexer cell ID, and three lower substrate rest parts are sending substrate rest parts SPASS1 to SPASS3 for the transfer of unprocessed substrates W from the indexer cell ID to the first cleaning processing cell SP1. That is, the substrate transfer part 50 includes the returning substrate rest parts RPASS1, RPASS2, RPASS3 and the sending substrate rest parts SPASS1, SPASS2, SPASS3 arranged in stacked relation in top-to-bottom order.

Each of the substrate rest parts (the sending substrate rest parts SPASS1 to SPASS3 and the returning substrate rest parts RPASS1 to RPASS3) includes three fixed support pins provided upright on a flat plate. The indexer robot 12 of the indexer cell ID and a transport robot TR1 of the first cleaning processing cell SP1 can gain access to each of the substrate rest parts to transfer substrates W to and from each of the substrate rest parts. The indexer robot 12 of the indexer cell ID places an unprocessed substrate W taken out of one of the cassettes C onto the sending substrate rest parts SPASS1 to SPASS3, and the transport robot TR1 of the first cleaning processing cell SP1 receives and takes out the unprocessed substrate W. In contrast to this, the transport robot TR1 places a processed substrate W subjected to the cleaning process onto the returning substrate rest parts RPASS1 to RPASS3, and the indexer robot 12 receives and takes out the processed substrate W to store the processed substrate W into one of the cassettes C. Each of the sending substrate rest parts SPASS1 to SPASS3 and the returning substrate rest parts RPASS1 to RPASS3 includes an optical sensor (not shown) for detecting the presence or absence of a substrate W thereon. Based on a detection signal from each of the sensors, a judgment is made as to whether or not the indexer robot 12 and the transport robot TR1 stand ready to transfer and receive a substrate W to and from each of the substrate rest parts.

A vertical spacing at which the sending substrate rest parts SPASS1 to SPASS3 are arranged and a vertical spacing at which the returning substrate rest parts RPASS1 to RPASS3 are arranged are equal to the spacing at which the pair of transport arms 13a and 13b of the indexer robot 12 are arranged. Thus, the indexer robot 12 can cause the pair of transport arms 13a and 13b to gain access to adjacent ones of the substrate rest parts (e.g., the sending substrate rest part SPASS1 and the sending substrate rest part SPASS2) at the same time. The pair of transport arms 13a and 13b are not permitted to gain access to the returning substrate rest part RPASS3 and the sending substrate rest part SPASS1 at the same time.

The first cleaning processing cell SP1 and the second cleaning processing cell SP2 are cells for performing the scrub cleaning process on substrates W. According to the first preferred embodiment, the first cleaning processing cell SP1 performs a front surface cleaning process on a substrate W, and the second cleaning processing cell SP2 performs a back surface cleaning process on a substrate W. The first cleaning processing cell SP1 includes cleaning processing parts SS1 and SS2 for performing the scrub cleaning process on the front surface (a surface formed with a device pattern) of a substrate W, and the transport robot TR1 for transferring a substrate W to and from the cleaning processing parts SS1 and SS2.

In the first cleaning processing cell SP1, the cleaning processing part SS1 and the cleaning processing part SS2 are arranged on opposite sides of the transport robot TR1. Specifically, the cleaning processing part SS1 is on the rear side of the substrate processing apparatus 1, and the cleaning processing part SS2 is on the front side thereof. Each of the cleaning processing part SS1 and the cleaning processing part SS2 includes four cleaning processing units similar in construction to each other and arranged in stacked relation. Each of the cleaning processing units in the first cleaning processing cell SP1 includes a spin chuck 22 for holding a substrate W in a horizontal position to rotate the substrate W about an axis extending in a vertical direction, a cleaning brush 23 in contact with or in proximity to the front surface of the substrate W held on the spin chuck 22 for performing scrub cleaning on the front surface of the substrate W, a nozzle for applying a cleaning liquid (e.g., deionized water) onto the front surface of the substrate W, a spin motor for rotatably driving the spin chuck 22, a cup surrounding the substrate W held on the spin chuck 22, and the like.

The transport robot TR1 includes a pair of (upper and lower) holding arms 6a and 6b in proximity to each other for holding a substrate W in a horizontal position. Each of the holding arms 6a and 6b includes a distal end portion of a substantially C-shaped plan configuration, and a plurality of pins projecting inwardly from the inside of the substantially C-shaped distal end portion for supporting the peripheral edge of a substrate W from below.

The transport robot TR1 further includes a base 8 fixedly mounted on an apparatus base (or an apparatus frame). A guide shaft 9a is mounted upright on the base 8, and a belt drive mechanism 9b is provided on the base 8. The belt drive mechanism 9b causes a timing belt to run around a pair of (upper and lower) pulleys by means of a pulse motor. As the belt drive mechanism 9b causes the timing belt to run around, a lift 10a connected to the timing belt is guided by the guide shaft 9a to move vertically upwardly and downwardly.

An arm base 10b is mounted on the lift 10a pivotably about an axis extending in a vertical direction. The lift 10a contains a motor for pivotably driving the arm base 10b. The pair of (upper and lower) holding arms 6a and 6b described above are provided on the arm base 10b. Each of the holding arms 6a and 6b is independently movable back and forth in a horizontal direction (in the direction of the pivot radius of the arm base 10b) by a sliding drive mechanism mounted in the arm base 10b.

With such an arrangement, the transport robot TR1 is capable of causing each of the pair of holding arms 6a and 6b to individually gain access to the substrate transfer part 50, a substrate transfer part 60, and the cleaning processing parts SS1 and SS2, thereby transferring and receiving substrates W to and from the above-mentioned parts. A vertical drive mechanism for the transport robot TR1 may employ other mechanisms such as a screw feed mechanism using a ball screw and the like.

The second cleaning processing cell SP2 is provided in adjacent relation to the first cleaning processing cell SP1. A partition for closing off the communication of atmosphere is provided between the first cleaning processing cell SP1 and the second cleaning processing cell SP2. The substrate transfer part 60 is provided to extend through the partition. That is, the substrate transfer part 60 is provided at an connecting portion of the first cleaning processing cell SP1 and the second cleaning processing cell SP2, and is present between the first cleaning processing cell SP1 and the second cleaning processing cell SP2 for the transfer of substrates W therebetween.

The substrate transfer part 60 includes two substrate rest parts arranged in vertically stacked relation. Each of the substrate rest parts of the substrate transfer part 60 is similar to that of the substrate transfer part 50, and includes three fixed support pins provided upright on a flat plate. Of the two substrate rest parts, an upper substrate rest part PASS4 is used for the transport of a substrate W from the second cleaning processing cell SP2 to the first cleaning processing cell SP1. Specifically, the transport robot TR1 of the first cleaning processing cell SP1 receives a substrate W placed on the substrate rest part PASS4 by a transport robot TR2 of the second cleaning processing cell SP2. A lower substrate rest part PASS5, on the other hand, is used for the transport of a substrate W from the first cleaning processing cell SP1 to the second cleaning processing cell SP2. Specifically, the transport robot TR2 of the second cleaning processing cell SP2 receives a substrate W placed on the substrate rest part PASS5 by the transport robot TR1 of the first cleaning processing cell SP1. Each of the substrate rest parts PASS4 and PASS5 includes an optical sensor (not shown) for detecting the presence or absence of a substrate W thereon. Based on a detection signal from each of the sensors, a judgment is made as to whether or not the transport robots TR1 and TR2 stand ready to transfer and receive a substrate W to and from each of the substrate rest parts.

The second cleaning processing cell SP2 includes cleaning processing parts SS3 and SS4 for performing the scrub cleaning process on the back surface of a substrate W, inverting units 41 and 42 for inverting or flipping a substrate W upside down and vice versa, and the transport robot TR2 for transferring a substrate W to and from the cleaning processing parts SS3 and SS4 and the inverting units 41 and 42.

In the second cleaning processing cell SP2, the cleaning processing part SS3 and the cleaning processing part SS4 are arranged on opposite sides of the transport robot TR2. Specifically, the cleaning processing part SS3 is on the rear side of the substrate processing apparatus 1, and the cleaning processing part SS4 is on the front side thereof. Each of the cleaning processing part SS3 and the cleaning processing part SS4 includes four cleaning processing units similar in construction to each other and arranged in stacked relation. Each of the cleaning processing units in the second cleaning processing cell SP2 is generally similar in construction to that in the first cleaning processing cell SP1, and includes a spin chuck 32 for holding a substrate W in a horizontal position to rotate the substrate W about an axis extending in a vertical direction, a cleaning brush 33 in contact with or in proximity to the back surface of the substrate W held on the spin chuck 32 for performing scrub cleaning on the back surface of the substrate W, a nozzle for applying a cleaning liquid (e.g., deionized water) onto the back surface of the substrate W, a spin motor for rotatably driving the spin chuck 32, a cup surrounding the substrate W held on the spin chuck 32, and the like. The spin chuck 22 in the first cleaning processing cell SP1 for the front surface cleaning may be of a vacuum suction type to hold the back surface of the substrate W, but the spin chuck 32 in the second cleaning processing cell SP2 must be of the type which mechanically grip the edge portion of the substrate W to hold the front surface of the substrate W.

The two inverting units 41 and 42 are provided at an end of a transport passage in which the transport robot TR2 is placed. The inverting unit 41 inverts (or rotates) a substrate W 180 degrees when the front surface of the substrate W is positioned to face upward. The inverting unit 42 inverts (or rotates) a substrate W 180 degrees when the back surface of the substrate W is positioned to face upward.

The transport robot TR2 is exactly identical in construction with the transport robot TR1. Thus, the transport robot TR2 is capable of causing a pair of holding arms thereof to individually gain access to the substrate transfer part 60, the inverting units 41 and 42, and the cleaning processing parts SS3 and SS4, thereby transferring and receiving substrates W to and from the above-mentioned parts.

Figure 4:
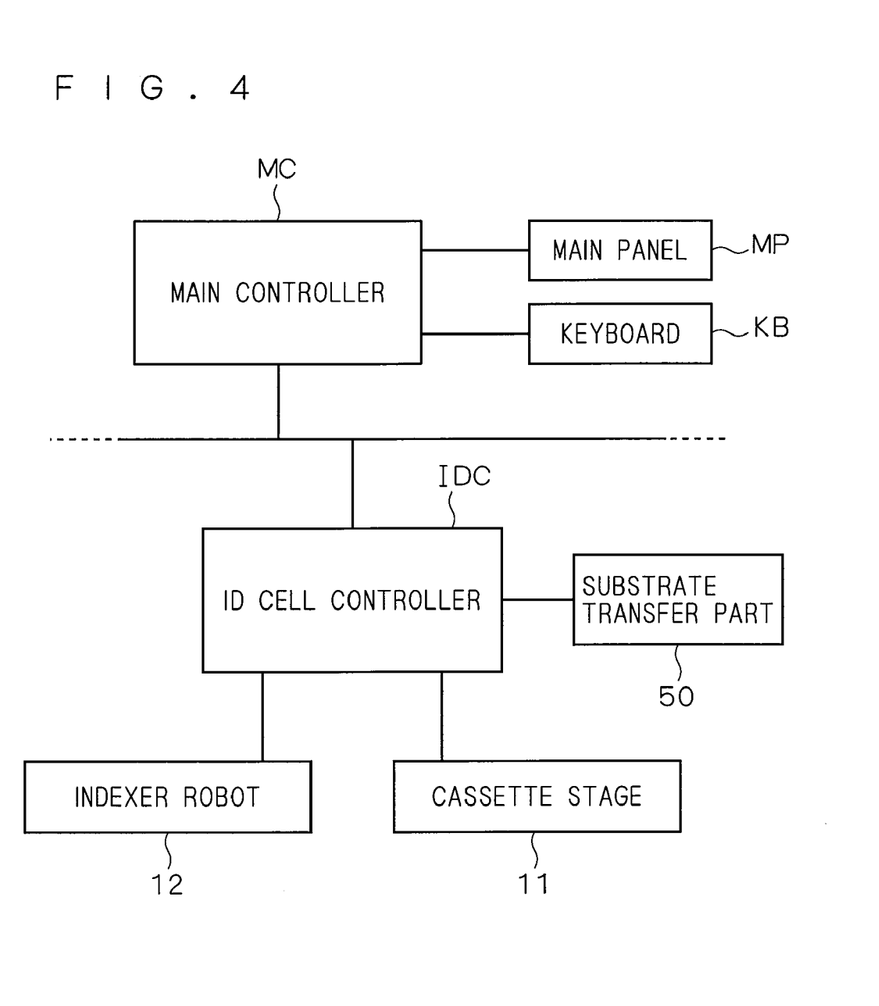
FIG. 4 is a block diagram showing the construction of principal parts of a control mechanism of the substrate processing apparatus.

Next, a control mechanism for the substrate processing apparatus 1 having the above-mentioned mechanical construction will be described. FIG. 4 is a block diagram showing the construction of principal parts of the control mechanism. The control mechanism for the substrate processing apparatus 1 has a hierarchical structure such that a plurality of lower-level controllers under the management of a main controller MC control the various parts of the substrate processing apparatus 1. The main controller MC and the plurality of lower-level controllers are similar in hardware construction to typical computers. Specifically, each of the controllers includes a CPU for performing various computation processes, a ROM or read-only memory for storing a basic program therein, a RAM or readable/writable memory for storing various pieces of information therein, a magnetic disk for storing control applications and data therein, and the like.

The main controller MC at the highest level is provided singly for the entire substrate processing apparatus 1, and is principally responsible for the management of the entire substrate processing apparatus 1, the management of a main panel MP, and the management of the lower-level controllers. The main panel MP functions as a display for the main controller MC. Various commands and parameters may be entered into the main controller MC from a keyboard KB. The main panel MP may be in the form of a touch panel so that a user performs an input process into the main controller MC from the main panel MP.

An ID cell controller IDC is provided as one of the plurality of lower-level controllers at a level lower than that of the main controller MC. The ID cell controller IDC controls the indexer robot 12 to take out an unprocessed substrate W from a cassette C and transport the unprocessed substrate W to the substrate transfer part 50, and also controls the indexer robot 12 to receive a processed substrate W placed on the substrate transfer part 50 and transport the processed substrate W to a cassette C. The substrate transfer part 50 and the cassette stage 11 are connected to the ID cell controller IDC. Detection signals indicating the presence or absence of a substrate W in the substrate transfer part 50 and the presence or absence of a cassette C on the cassette stage 11 are transmitted to the ID cell controller IDC. Although not shown in FIG. 4, exclusive cell controllers are provided for the first cleaning processing cell SP1 and the second cleaning processing cell SP2, respectively, to control the operating mechanisms provided in the corresponding cells.

Next, description will be given on the operation of the substrate processing apparatus 1 according to the first preferred embodiment, and more particularly on a procedure for the transport of substrates W in the substrate processing apparatus 1. The procedure to be described below is executed by the main controller MC providing instructions to the lower-level controllers in accordance with descriptions of a recipe in which the procedure and processing conditions are described. First, the AGV or the like loads unprocessed substrates W stored in a cassette C from the outside of the substrate processing apparatus 1 onto the cassette stage 11 of the indexer cell ID. Subsequently, the indexer robot 12 takes an unprocessed substrate W from the cassette C, and transports the unprocessed substrate W to the sending substrate rest parts SPASS1 to SPASS3 of the substrate transfer part 50. The transport operation of the indexer robot 12 in this step will be described later.

After the unprocessed substrate W is placed on the sending substrate rest parts SPASS1 to SPASS3, the transport robot TR1 of the first cleaning processing cell SP1 uses one of the holding arms 6a and 6b to receive the unprocessed substrate W. The transport robot TR1 transports the received unprocessed substrate W to one of the cleaning processing units of the cleaning processing part SS1 or SS2. In the cleaning processing units of the cleaning processing parts SS1 and SS2, the scrub cleaning process is performed on the front surface of the substrate W.

Next, the transport robot TR1 takes the substrate W subjected to the front surface cleaning process from the cleaning processing unit, and places the substrate W onto the substrate rest part PASS5 of the substrate transfer part 60. The transport robot TR2 of the second cleaning processing cell SP2 transports the substrate W placed on the substrate rest part PASS5 to the inverting unit 41. In the inverting unit 41, the substrate W is inverted (or rotated) 180 degrees so that the front surface of the substrate W faces downward. The transport robot TR2 transports the inverted substrate W to one of the cleaning processing units of the cleaning processing part SS3 or SS4. In the cleaning processing units of the cleaning processing parts SS3 and SS4, the scrub cleaning process is performed on the back surface of the substrate W.

The transport robot TR2 takes the substrate W subjected to the back surface cleaning process from the cleaning processing unit, and transports the substrate W to the inverting unit 42. In the inverting unit 42, the substrate W is inverted (or rotated) 180 degrees so that the front surface of the substrate W faces upward again. Thereafter, the transport robot TR2 places the substrate W subjected to the cleaning processes of the front and back surfaces thereof as a processed substrate W onto the substrate rest part PASS4 of the substrate transfer part 60. The transport robot TR1 of the first cleaning processing cell SP1 transports the substrate W placed on the substrate rest part PASS4 directly to the returning substrate rest parts RPASS1 to RPASS3 of the substrate transfer part 50. The indexer robot 12 stores the processed substrate W placed on the returning substrate rest parts RPASS1 to RPASS3 into a cassette C for storing processed substrates.

Although both the front and back surfaces of the substrate W are described as cleaned in the above-mentioned instance, there are cases where only the front surface or the back surface of the substrate W is cleaned. In the case of the cleaning of only the front surface of the substrate W, the transport robot TR1 takes the substrate W subjected to the front surface cleaning process in one of the cleaning processing units of the cleaning processing part SS1 or SS2, and immediately transports the substrate W to the returning substrate rest parts RPASS1 to RPASS3 of the substrate transfer part 50. In other words, the case of the cleaning of only the front surface requires very short cycle time between the transfer of a single substrate W from the indexer cell ID to the first cleaning processing cell SP1 and the return of the single substrate W to the indexer cell ID. Thus, the throughput of the entire substrate processing apparatus 1 is determined by substrate transport time in the indexer cell ID.

Figure 5:
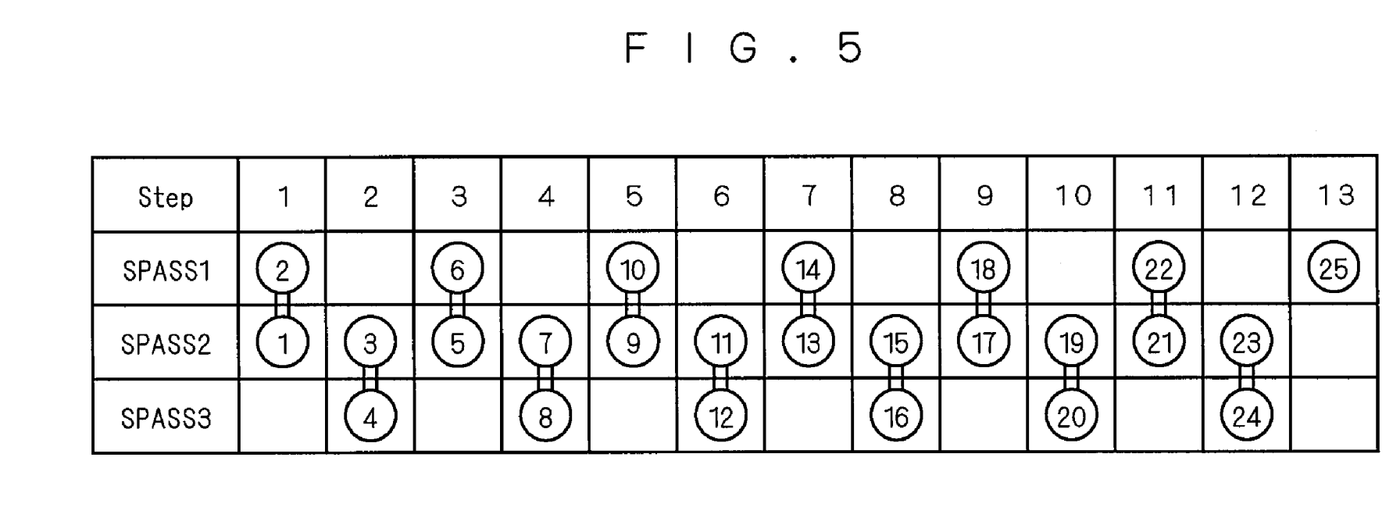
FIG. 5 shows a procedure for the transport of substrates in an indexer cell according to a first preferred embodiment of the present invention.

In the first preferred embodiment, the transport time per substrate W in the indexer cell ID is reduced by the transport control effected by the ID cell controller IDC which will be described below. FIG. 5 shows a procedure for the transport of substrates in the indexer cell ID according to the first preferred embodiment. In this instance, it is assumed that 25 substrates W in a lot (or batch) are stored in a cassette C and are transferred in succession to the first cleaning processing cell SP1. In FIG. 5, circled numerals denote the sequence of processing of the 25 substrates W which is determined by the recipe. For particular designation of the sequence of processing of the substrates W, the first substrate W to be processed is designated by the reference character W1, the tenth substrate W to be processed is designated by the reference character W10, and so on.

In the first preferred embodiment, the indexer robot 12 takes two unprocessed substrates W, e.g. unprocessed substrates W1 and W2, from a cassette C, and transports the two unprocessed substrates W to the substrate transfer part 50 simultaneously. Specifically, the indexer robot 12 moves to the front of a cassette C with the unprocessed substrates W stored therein, and positions the transport arms 13a and 13b in opposed relation to the cassette C. First, the lower transport arm 13b moves forward to under the substrate W1, moves upwardly slightly to receive the substrate W1, and then moves backward. Subsequently, the upper transport arm 13a moves forward to under the substrate W2, moves upwardly slightly to receive the substrate W2, and then moves backward. At this time, the single unprocessed substrate W is held by each of the two transport arms 13a and 13b. A spacing at which substrates are stored in the cassette C is previously determined by standards for semiconductor manufacture, and the two transport arms 13a and 13b are not permitted to simultaneously move forward to simultaneously receive two unprocessed substrates W from the cassette C.

Next, the indexer robot 12 moves horizontally to the front of the substrate transfer part 50, and positions the transport arms 13a and 13b in opposed relation to the substrate transfer part 50. Then, the indexer robot 12 loads the two unprocessed substrates W1 and W2 into the substrate transfer part 50 simultaneously. Specifically, the two transport arms 13a and 13b which hold the substrates W2 and W1, respectively, move forward simultaneously to over the sending substrate rest parts SPASS1 and SPASS2, respectively. Subsequently, the arm stage 12b moves downwardly slightly to simultaneously move the two transport arms 13a and 13b downwardly. Since the spacing at which the sending substrate rest parts SPASS1 to SPASS3 are disposed is equal to the spacing at which the two transport arms 13a and 13b are disposed, the simultaneous downward movement of the two transport arms 13a and 13b causes the simultaneous transfer of the two unprocessed substrates W1 and W2 to the sending substrate rest parts SPASS2 and SPASS1, respectively. Thereafter, the two transport arms 13a and 13b move backward, and the loading of the substrates W1 and W2 into the substrate transfer part 50 is completed. Subsequently, two unprocessed substrates W3 and W4 are simultaneously transported to the sending substrate rest parts SPASS2 and SPASS3, and two unprocessed substrates W5 and W6 are simultaneously transported to the sending substrate rest parts SPASS2 and SPASS1 in a similar manner. In FIG. 5, the circles surrounding the numerals corresponding to each pair of unprocessed substrates W transported simultaneously in this manner are shown as connected by a double line.

After the loading of the unprocessed substrates W into the substrate transfer part 50, the indexer robot 12 receives processed substrates W placed on the returning substrate rest parts RPASS1 to RPASS3, and transports the processed substrates W to a cassette C. Since the spacing at which the returning substrate rest parts RPASS1 to RPASS3 are disposed is equal to the spacing at which the two transport arms 13a and 13b are disposed, the indexer robot 12 takes the two processed substrates W from the returning substrate rest parts RPASS1 to RPASS3 of the substrate transfer part 50, and simultaneously transports the two processed substrates W to the cassette C. It should be noted that the two processed substrates W are stored on a one-by-one basis into the cassette C in a manner similar to those taken therefrom.

The time required for one cycle between the instant at which the indexer robot 12 takes an unprocessed substrate W from a cassette C to transport the unprocessed substrate W to the sending substrate rest parts SPASS1 to SPASS3 of the substrate transfer part 50 and the instant at which the indexer robot 12 receives a processed substrate W from the returning substrate rest parts RPASS1 to RPASS3 to store the processed substrate W into a cassette C is calculated based on Table 1 below.

TABLE 1

| Step | Details of Operation | Time Required |
|---|---|---|
| (a) | Move from Current Position to Front of Cassette | 2 sec. |
| (b) | Take Substrate from Cassette | 2 sec. |
| (c) | Move to Substrate Transfer Part (Sending Substrate Rest Parts) | 2 sec. |
| (d) | Load Substrate onto Sending Substrate Rest Part | 2 sec. |
| (e) | Move to Substrate Transfer Part (Returning Substrate Rest Parts) | 2 sec. |
| (f) | Unload Substrate from Returning Substrate Rest Part | 2 sec. |
| (g) | Move to Front of Cassette for Storage | 2 sec. |
| (h) | Store Substrate into Cassette | 2 sec. |

As shown in Table 1, the time required for the indexer robot 12 to transport a single unprocessed substrate W from a cassette C to the substrate transfer part 50 and transport a single processed substrate W from the substrate transfer part 50 to a cassette C is 16 seconds which is the sum of the times required for Steps (a) to (h). In other words, the time required for the indexer robot 12 in the indexer cell ID to transport each substrate W is 16 seconds.

As in the first preferred embodiment, when the indexer robot 12 simultaneously transports two unprocessed substrates W from a cassette C to the substrate transfer part 50 and simultaneously transports two processed substrates W from the substrate transfer part 50 to a cassette C, it is necessary to repeat Steps (a) and (b) and Steps (g) and (h) twice because the indexer robot 12 can transfer substrates W only on a one-by-one basis to and from the cassette C. On the other hand, it is sufficient to perform Steps (c) to (f) only once in a manner similar to the transport of the single substrate because the indexer robot 12 can transfer substrates W, two at a time, to and from the substrate transfer part 50. As a result, the time required for one cycle of the indexer robot 12 is 24 seconds. Thus, the time required to transport a single substrate W in the indexer cell ID is 24/2=12 seconds. This is shorter by 4 seconds than the transport of the single substrate.

To accomplish such simultaneous two-substrate transport, at least two sending substrate rest parts and at least two returning substrate rest parts in the substrate transfer part 50 might be considered sufficient. The timing for the ID cell controller IDC to cause the indexer robot 12 to start the transport operation can be of two types: "the operation is started after the sending substrate rest parts are recognized to be vacant" and "the operation is started regardless of whether the sending substrate rest parts are vacant or not."

In the case where "the operation is started after the sending substrate rest parts are recognized to be vacant," the indexer robot 12 starts the operation after the transport robot TR1 unloads all substrates W from the sending substrate rest parts and the ID cell controller IDC recognizes the sending substrate rest parts to be vacant. This produces waiting time for the indexer robot 12 so that a throughput as high as 12 seconds per cycle as mentioned above cannot be attained. In the case where "the operation is started regardless of whether the sending substrate rest parts are vacant or not," on the other hand, there is a possibility that a deadlock occurs such that the operations of the indexer robot 12 and the transport robot TR1 stop because the indexer robot 12 cannot gain access to the sending substrate rest parts while holding unprocessed substrates W and the transport robot TR1 cannot gain access to the returning substrate rest parts while holding processed substrates W.

In this manner, two sending substrate rest parts and two returning substrate rest parts in the substrate transfer part 50 are insufficient for the accomplishment of the simultaneous two-substrate transport, but it is necessary to provide at least three sending substrate rest parts in the substrate transfer part 50. Thus, the three sending substrate rest parts SPASS1 to SPASS3 and the three returning substrate rest parts RPASS1 to RPASS3 are provided in the substrate transfer part 50 according to the first preferred embodiment to smoothly accomplish the simultaneous two-substrate transport. As a result, the time required for the transport per substrate in the indexer cell ID which is 12 seconds can be attained. This means the attainment of a throughput of 300 substrates per hour.

In the first step of simultaneous two-substrate transport according to the first preferred embodiment as shown in FIG. 5, the unprocessed substrate W1 which is the first to be processed is transported to the sending substrate rest part SPASS2 in the middle tier, and the unprocessed substrate W2 which is the second to be processed is transported to the sending substrate rest part SPASS1 in the top tier. Specifically, the indexer robot 12 takes the unprocessed substrates W from a cassette C in such a manner that the lower transport arm 13b is used to take the substrate W1 and the upper transport arm 13a is used to take the substrate W2. This enables the substrate W1 to be loaded onto the sending substrate rest part SPASS2 in the middle tier when the simultaneous two-substrate transport to the substrate transfer part 50 is accomplished.

Similarly, in the second step of simultaneous two-substrate transport, the unprocessed substrate W3 which is the third to be processed is transported to the sending substrate rest part SPASS2 in the middle tier, and the unprocessed substrate W4 which is the fourth to be processed is transported to the sending substrate rest part SPASS3 in the bottom tier. In the third step of simultaneous two-substrate transport, the unprocessed substrate W5 which is the fifth to be processed is transported to the sending substrate rest part SPASS2 in the middle tier, and the unprocessed substrate W6 which is the sixth to be processed is transported to the sending substrate rest part SPASS1 in the top tier. In this manner, whenever the simultaneous two-substrate transport is accomplished, the earlier one of the two substrates W to be processed is transported to the sending substrate rest part SPASS2 in the middle tier.

The manner in which the two transport arms 13a and 13b simultaneously transport two substrates W to the three sending substrate rest parts SPASS1 to SPASS3 as in the first preferred embodiment is limited to two types: the simultaneous two-substrate transport to the two upper sending substrate rest parts SPASS1 and SPASS2; and the simultaneous two-substrate transport to the two lower sending substrate rest parts SPASS2 and SPASS3. In either type of manner, one of the substrates W is always transported to the sending substrate rest part SPASS2 in the middle tier. In other words, the sending substrate rest part SPASS2 in the middle tier which is an overlap between the two upper ones and the two lower ones of the three sending substrate rest parts SPASS1 to SPASS3 is an overlapping substrate rest part to which an unprocessed substrate W is always transported regardless of the types of the simultaneous two-substrate transport. This means that the simultaneous two-substrate transport cannot be accomplished unless the sending substrate rest part SPASS2 in the middle tier is vacant.

For this reason, the substrate W to be processed earlier of the two unprocessed substrates W transported simultaneously is loaded preferentially onto the sending substrate rest part SPASS2 in the middle tier corresponding to the overlapping substrate rest part. In this manner, after the substrate W1 which is the first to be processed and the substrate W2 which is the second to be processed, for example, are loaded onto the sending substrate rest parts SPASS2 and SPASS1 respectively, the substrate W1 is unloaded earlier from the sending substrate rest part SPASS2 by the transport robot TR1 so that the sending substrate rest part SPASS2 in the middle tier corresponding to the overlapping substrate rest part becomes vacant earlier than the sending substrate rest part SPASS1. As a result, the sending substrate rest part SPASS2 in the middle tier and the sending substrate rest part SPASS3 in the bottom tier are vacant. This smoothly accomplishes the simultaneous transport of the subsequent two substrates, i.e., the substrate W3 which is the third to be processed and the substrate W4 which is the fourth to be processed.

If the unprocessed substrate W1 which is the first to be processed is transported to the sending substrate rest part SPASS1 in the top tier and the unprocessed substrate W2 which is the second to be processed is transported to the sending substrate rest part SPASS2 in the middle tier unlike the procedure of FIG. 5, the sending substrate rest part SPASS1 becomes vacant earlier than the sending substrate rest part SPASS2. Then, the sending substrate rest part SPASS1 and the sending substrate rest part SPASS3 are vacant while the substrate W2 is left on the sending substrate rest part SPASS2 in the middle tier. As a result, the indexer robot 12 must wait until the sending substrate rest part SPASS2 becomes vacant.

The above-mentioned simultaneous two-substrate transport is performed on 24 out of the 25 unprocessed substrates W stored in the cassette C. In the instance shown in FIG. 5, the simultaneous two-substrate transport is performed on the substrates W1 to W24. In this process, since the substrate W to be processed earlier of the two unprocessed substrates W transported simultaneously is loaded preferentially onto the sending substrate rest part SPASS2 in the middle tier corresponding to the overlapping substrate rest part, the overlapping substrate rest part always becomes vacant preferentially. This smoothly accomplishes the plurality of steps of simultaneous two-substrate transport in succession. As a result, the first preferred embodiment reduces the time required for the transport of substrates in the entire substrate processing apparatus 1 to attain high throughput.

When an odd number of substrates, e.g. 25 substrates in the above-mentioned instance, are stored in the cassette C, the last substrate W25 is transported alone by the indexer robot 12 (non-simultaneous transport). When the indexer robot 12 transports the single unprocessed substrate W25, the indexer robot 12 loads the substrate W25 onto other than the sending substrate rest part SPASS2 in the middle tier corresponding to the overlapping substrate rest part in the substrate transfer part 50, in contrast to the above-mentioned simultaneous transport. In the instance shown in FIG. 5, the substrate W25 transported alone is loaded onto the sending substrate rest part SPASS1.

In this manner, the sending substrate rest part SPASS2 in the middle tier corresponding to the overlapping substrate rest part remains vacant during the single-substrate transport. Thus, when unprocessed substrates W are taken in succession from a plurality of cassettes C, the simultaneous two-substrate transport can be smoothly started immediately from the subsequent one of the cassettes C. Of the 25 substrates, the substrates W1 to W24 are subjected to the simultaneous two-substrate transport and the last substrate W25 is subjected to the single-substrate transport in the instance shown in FIG. 5. However, any substrate may be transported alone, i.e., subjected to the single-substrate transport. In this case, the substrate W subjected to the single-substrate transport is transported to either the sending substrate rest part SPASS1 in the top tier or the sending substrate rest part SPASS3 in the bottom tier, rather than the sending substrate rest part SPASS2 in the middle tier corresponding to the overlapping substrate rest part. This smoothly accomplishes the subsequent step of simultaneous two-substrate transport, to thereby reduce the time required for the transport of substrates in the entire substrate processing apparatus 1.

2. Second Preferred Embodiment

Next, a second preferred embodiment according to the present invention will be described. According to the second preferred embodiment, the substrate transfer part 50 of the first preferred embodiment includes four sending substrate rest parts and four returning substrate rest parts arranged in vertically stacked relation. The remaining structure of the second preferred embodiment is similar to the corresponding structure of the first preferred embodiment.

Figure 6:
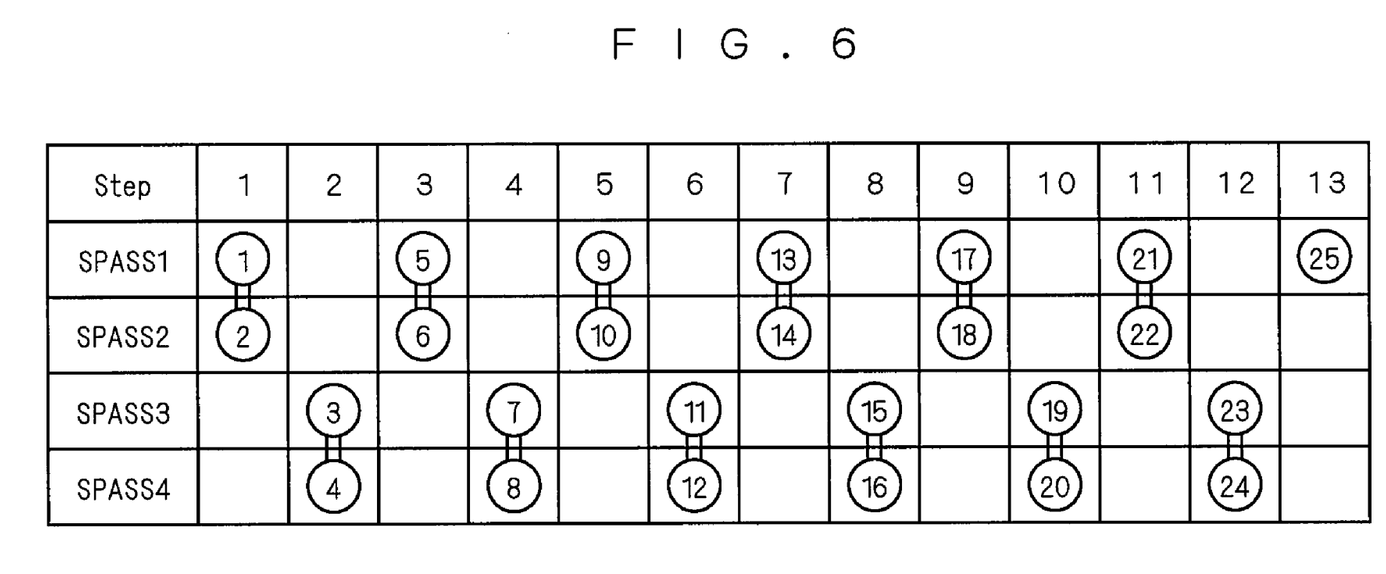
FIG. 6 shows a procedure for the transport of substrates in the indexer cell according to a second preferred embodiment of the present invention.

FIG. 6 shows a procedure for the transport of substrates in the indexer cell ID according to the second preferred embodiment. In a manner similar to FIG. 5 according to the first preferred embodiment, circled numerals denote the sequence of processing of the 25 substrates W which is determined by the recipe, and the circles surrounding the numerals corresponding to each pair of unprocessed substrates W transported simultaneously are shown as connected by a double line. Also in the second preferred embodiment, the simultaneous two-substrate transport is accomplished, that is, the indexer robot 12 simultaneously transports two unprocessed substrates W from a cassette C to the substrate transfer part 50 in such a manner that each of the two transport arms holds a single unprocessed substrate W. Also, the indexer robot 12 simultaneously receives two processed substrates W from the substrate transfer part 50 and simultaneously transports the two processed substrates W to a cassette C in such a manner that each of the two transport arms holds a single processed substrate W. The second preferred embodiment is similar to the first preferred embodiment in transferring substrates W collectively to and from the substrate transfer part 50 and in transferring substrates W on a one-by-one basis to and from a cassette C.

As discussed above, two sending substrate rest parts and two returning substrate rest parts in the substrate transfer part 50 are insufficient for the accomplishment of the simultaneous two-substrate transport, but it is necessary to provide at least three sending substrate rest parts in the substrate transfer part 50. According to the second preferred embodiment, four sending substrate rest parts SPASS1 to SPASS4 and four returning substrate rest parts RPASS1 to RPASS4 are provided in the substrate transfer part 50 to smoothly accomplish a plurality of steps of simultaneous two-substrate transport in succession using the indexer robot 12, thereby reducing the time required for the transport of substrates in the entire substrate processing apparatus 1.

Additionally, the second preferred embodiment does not have the overlapping substrate rest part onto which substrates are loaded in common during successive steps of simultaneous two-substrate transport because of the provision of the four sending substrate rest parts. In the first step of simultaneous two-substrate transport in the instance shown in FIG. 6, the unprocessed substrate W1 which is the first to be processed is transported to the sending substrate rest part SPASS1 in the topmost tier, and the unprocessed substrate W2 which is the second to be processed is transported to the sending substrate rest part SPASS2 in the second tier. In the second step of simultaneous two-substrate transport, the unprocessed substrate W3 which is the third to be processed is transported to the sending substrate rest part SPASS3 in the third tier, and the unprocessed substrate W4 which is the fourth to be processed is transported to the sending substrate rest part SPASS4 in the bottommost tier. Subsequently, a step of simultaneous two-substrate transport to the sending substrate rest parts SPASS1 and SPASS2 and a step of simultaneous two-substrate transport to the sending substrate rest parts SPASS3 and SPASS4 are similarly repeated in alternate order.

As described above, the second preferred embodiment does not have the overlapping substrate rest part corresponding to an overlap between the two upper ones and the two lower ones of the fourth sending substrate rest parts SPASS1 to SPASS4. This avoids the occurrence of an event such that it is impossible to perform the next step of simultaneous transport because the overlapping substrate rest part does not become vacant. Thus, the second preferred embodiment eliminates the need for the transport method of loading a substrate W to be processed earlier onto the overlapping substrate rest part preferentially and transporting a substrate W to other than the overlapping substrate rest part during the single-substrate transport as in the first preferred embodiment, to facilitate the transport control. However, the first preferred embodiment can reduce the space occupied by the substrate transfer part 50 because of a smaller number of tiers, i.e. a smaller number of substrate rest parts, in the substrate transfer part 50.

3. Third Preferred Embodiment

Next, a third preferred embodiment according to the present invention will be described. According to the third preferred embodiment, the indexer robot 12 of the first preferred embodiment includes three transport arms disposed vertically at a predetermined spacing, and the substrate transfer part 50 includes four sending substrate rest parts and four returning substrate rest parts arranged in vertically stacked relation. The remaining structure of the third preferred embodiment is similar to the corresponding structure of the first preferred embodiment.

Figure 7:
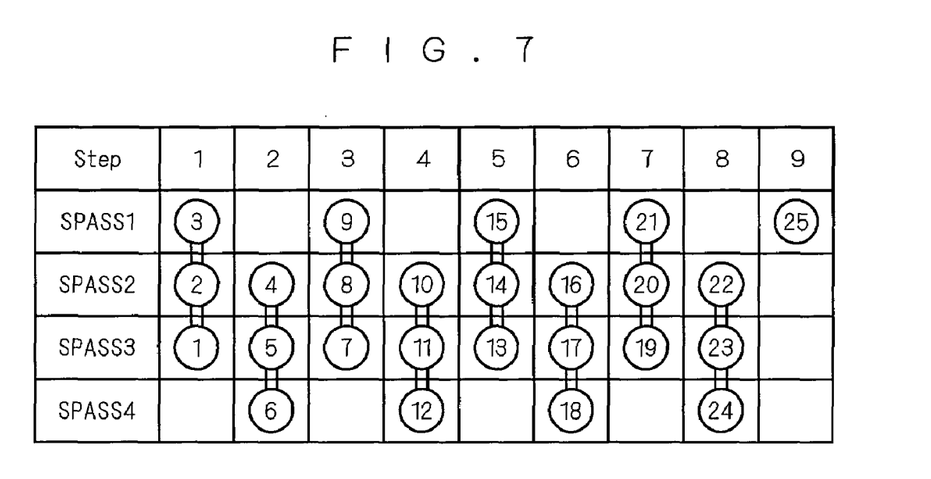
FIG. 7 shows a procedure for the transport of substrates in the indexer cell according to a third preferred embodiment of the present invention.

FIG. 7 shows a procedure for the transport of substrates in the indexer cell ID according to the third preferred embodiment. In a manner similar to FIG. 5 according to the first preferred embodiment, circled numerals denote the sequence of processing of the 25 substrates W which is determined by the recipe, and the circles surrounding the numerals corresponding to each group of unprocessed substrates W transported simultaneously are shown as connected by double lines. In the third preferred embodiment, the indexer robot 12 includes the three transport arms, and simultaneous three-substrate transport is accomplished, that is, the indexer robot 12 simultaneously transports three unprocessed substrates W from a cassette C to the substrate transfer part 50 in such a manner that each of the three transport arms holds a single unprocessed substrate W. Also, the indexer robot 12 simultaneously receives three processed substrates W from the substrate transfer part 50 and simultaneously transports the three processed substrates W to a cassette C in such a manner that each of the three transport arms holds a single processed substrate W. The third preferred embodiment is similar to the first preferred embodiment in transferring substrates W collectively to and from the substrate transfer part 50 and in transferring substrates W on a one-by-one basis to and from a cassette C.

For reasons similar to those described in the first preferred embodiment, three sending substrate rest parts and three returning substrate rest parts in the substrate transfer part 50 are insufficient for the accomplishment of the simultaneous three-substrate transport, but it is necessary to provide at least four sending substrate rest parts in the substrate transfer part 50. According to the third preferred embodiment, the four sending substrate rest parts SPASS1 to SPASS4 and the four returning substrate rest parts RPASS1 to RPASS4 are provided in the substrate transfer part 50 to smoothly accomplish the simultaneous three-substrate transport by using the indexer robot 12, thereby reducing the time required for the transport of substrates in the entire substrate processing apparatus 1.

In the first step of the simultaneous three-substrate transport according to the third preferred embodiment, as shown in FIG. 7, the unprocessed substrate W1 which is the first to be processed is transported to the sending substrate rest part SPASS3 in the third tier, the unprocessed substrate W2 which is the second to be processed is transported to the sending substrate rest part SPASS2 in the second tier, and the unprocessed substrate W3 which is the third to be processed is transported to the sending substrate rest part SPASS1 in the topmost tier. In the second step of simultaneous three-substrate transport, the unprocessed substrate W4 which is the fourth to be processed is transported to the sending substrate rest part SPASS2 in the second tier, the unprocessed substrate W5 which is the fifth to be processed is transported to the sending substrate rest part SPASS3 in the third tier, and the unprocessed substrate W6 which is the sixth to be processed is transported to the sending substrate rest part SPASS4 in the bottommost tier. Subsequently, a step of simultaneous three-substrate transport to the three upper sending substrate rest parts SPASS1, SPASS2 and SPASS3 and a step of simultaneous three-substrate transport to the three lower sending substrate rest parts SPASS2, SPASS3 and SPASS4 are similarly repeated in alternate order. When the simultaneous three-substrate transport is accomplished, the earliest one of the three substrates W to be processed is loaded preferentially onto the sending substrate rest part SPASS2 or the sending substrate rest part SPASS3 in an inner tier.

The manner in which the three transport arms simultaneously transport three substrates W to the four sending substrate rest parts SPASS1 to SPASS4 as in the third preferred embodiment is limited to two types: the simultaneous three-substrate transport to the three upper sending substrate rest parts SPASS1 to SPASS3; and the simultaneous three-substrate transport to the three lower sending substrate rest parts SPASS2 to SPASS4. In either type of manner, substrate W are transported to the sending substrate rest part SPASS2 and the sending substrate rest part SPASS3 in common. In other words, the sending substrate rest part SPASS2 and the sending substrate rest part SPASS3 which are overlaps between the three upper ones and the three lower ones of the four sending substrate rest parts SPASS1 to SPASS4 are overlapping substrate rest parts to which unprocessed substrates W are transported regardless of the types of the simultaneous three-substrate transport. This means that the simultaneous three-substrate transport cannot be accomplished unless the sending substrate rest parts SPASS2 and SPASS3 are vacant.

For this reason, according to the third preferred embodiment, the substrate W to be processed earliest of the three unprocessed substrates W transported simultaneously is loaded preferentially onto the sending substrate rest parts SPASS2 and SPASS3 corresponding to the overlapping substrate rest parts. As a result, the overlapping substrate rest parts always become vacant preferentially. This smoothly accomplishes the plurality of steps of simultaneous three-substrate transport in succession, to reduce the time required for the transport of substrates in the entire substrate processing apparatus 1.

When the indexer robot 12 transports the single substrate W alone to the substrate transfer part 50, the indexer robot 12 loads the substrate onto other than the sending substrate rest parts SPASS2 and SPASS3 corresponding to the overlapping substrate rest parts in the substrate transfer part 50 in a manner similar to the first preferred embodiment. In the instance shown in FIG. 7, the substrate W25 is subjected to the single-substrate transport, and the indexer robot 12 loads the substrate W25 onto the sending substrate rest part SPASS1, rather than the sending substrate rest parts SPASS2 and SPASS3.

In this manner, the sending substrate rest parts SPASS2 and SPASS3 corresponding to the overlapping substrate rest parts remain vacant during the single-substrate transport. This smoothly accomplishes the subsequent step of simultaneous three-substrate transport (i.e., the simultaneous three-substrate transport from the subsequent cassette C) to thereby reduce the time required for the transport of substrates in the entire substrate processing apparatus 1.

4. Fourth Preferred Embodiment

Next, a fourth preferred embodiment according to the present invention will be described. According to the fourth preferred embodiment, the indexer robot 12 of the first preferred embodiment includes three transport arms disposed vertically at a predetermined spacing, and the substrate transfer part 50 includes five sending substrate rest parts and five returning substrate rest parts arranged in vertically stacked relation. The remaining structure of the fourth preferred embodiment is similar to the corresponding structure of the first preferred embodiment.

Figure 8:
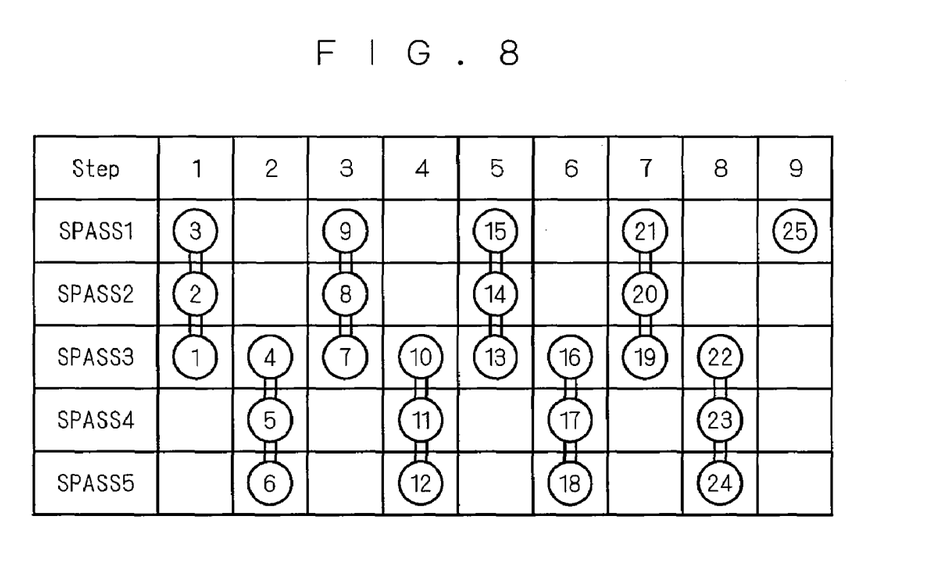
FIG. 8 shows a procedure for the transport of substrates in the indexer cell according to a fourth preferred embodiment of the present invention.

FIG. 8 shows a procedure for the transport of substrates in the indexer cell ID according to the fourth preferred embodiment. In a manner similar to FIG. 5 according to the first preferred embodiment, circled numerals denote the sequence of processing of the 25 substrates W which is determined by the recipe, and the circles surrounding the numerals corresponding to each group of unprocessed substrates W transported simultaneously are shown as connected by double lines. In the fourth preferred embodiment, the indexer robot 12 includes the three transport arms, and the simultaneous three-substrate transport is accomplished, that is, the indexer robot 12 simultaneously transports three unprocessed substrates W from a cassette C to the substrate transfer part 50 in such a manner that each of the three transport arms holds a single unprocessed substrate W. Also, the indexer robot 12 simultaneously receives three processed substrates W from the substrate transfer part 50 and simultaneously transports the three processed substrates W to a cassette C in such a manner that each of the three transport arms holds a single processed substrate W. The fourth preferred embodiment is similar to the first preferred embodiment in transferring substrates W collectively to and from the substrate transfer part 50 and in transferring substrates W on a one-by-one basis to and from a cassette C.

For reasons similar to those described in the first preferred embodiment, three sending substrate rest parts and three returning substrate rest parts in the substrate transfer part 50 are insufficient for the accomplishment of the simultaneous three-substrate transport, but it is necessary to provide at least four sending substrate rest parts in the substrate transfer part 50. According to the fourth preferred embodiment, five sending substrate rest parts SPASS1 to SPASS5 and five returning substrate rest parts RPASS1 to RPASS5 are provided in the substrate transfer part 50 to smoothly accomplish the simultaneous three-substrate transport by using the indexer robot 12, thereby reducing the time required for the transport of substrates in the entire substrate processing apparatus 1.

In the first step of simultaneous three-substrate transport according to the fourth preferred embodiment, as shown in FIG. 8, the unprocessed substrate W1 which is the first to be processed is transported to the sending substrate rest part SPASS3 in the third tier, the unprocessed substrate W2 which is the second to be processed is transported to the sending substrate rest part SPASS2 in the second tier, and the unprocessed substrate W3 which is the third to be processed is transported to the sending substrate rest part SPASS1 in the topmost tier. In the second step of simultaneous three-substrate transport, the unprocessed substrate W4 which is the fourth to be processed is transported to the sending substrate rest part SPASS3 in the third tier, the unprocessed substrate W5 which is the fifth to be processed is transported to the sending substrate rest part SPASS4 in the fourth tier, and the unprocessed substrate W6 which is the sixth to be processed is transported to the sending substrate rest part SPASS5 in the bottommost tier. Subsequently, a step of simultaneous three-substrate transport to the three upper sending substrate rest parts SPASS1, SPASS2 and SPASS3 and a step of simultaneous three-substrate transport to the three lower sending substrate rest parts SPASS3, SPASS4 and SPASS5 are similarly repeated in alternate order. When the simultaneous three-substrate transport is accomplished, the earliest one of the three substrates W to be processed is loaded preferentially onto the sending substrate rest part SPASS3 in the middle tier.

According to the fourth preferred embodiment, the sending substrate rest part SPASS3 in the middle tier which is an overlap between the three upper ones and the three lower ones of the five sending substrate rest parts SPASS1 to SPASS5 is an overlapping substrate rest part. For this reason, the substrate W (corresponding to the substrates W1, W4, W7, . . . , and W22 in the instance shown in FIG. 8) to be processed earliest of the three unprocessed substrates W transported simultaneously is loaded preferentially onto the sending substrate rest part SPASS3 corresponding to the overlapping substrate rest part. As a result, the overlapping substrate rest part always becomes vacant preferentially. This smoothly accomplishes the plurality of steps of simultaneous three-substrate transport in succession, to reduce the time required for the transport of substrates in the entire substrate processing apparatus 1.

When the indexer robot 12 transports the single substrate W alone to the substrate transfer part 50, the indexer robot 12 loads the substrate onto other than the sending substrate rest part SPASS3 corresponding to the overlapping substrate rest part in the substrate transfer part 50 in a manner similar to the first preferred embodiment. In the instance shown in FIG. 8, the substrate W25 is subjected to the single-substrate transport, and the indexer robot 12 loads the substrate W25 onto the sending substrate rest part SPASS1, rather than the sending substrate rest part SPASS3.

In this manner, the sending substrate rest part SPASS3 corresponding to the overlapping substrate rest part remains vacant during the single-substrate transport. This smoothly accomplishes the subsequent step of simultaneous three-substrate transport (i.e., the simultaneous three-substrate transport from the subsequent cassette C) to thereby reduce the time required for the transport of substrates in the entire substrate processing apparatus 1.

5. Summation

The best modes for carrying out the present invention have been described above by using the first to fourth preferred embodiment as examples, and will be summarized below. First, the indexer robot 12 of the indexer cell ID includes N transport arms (where N is an integer not less than two) disposed at a predetermined spacing. The indexer robot 12 does not transport substrates W on a one-by-one basis from a cassette C to the substrate transfer part 50, but simultaneously transports N unprocessed substrates W from a cassette C on the cassette stage 11 and simultaneously loads the N unprocessed substrates W into the substrate transfer part 50 in such a manner that each of the N transport arms holds a single unprocessed substrate W. Also, the indexer robot 12 simultaneously receives N processed substrates W from the substrate transfer part 50 and simultaneously transports the N processed substrates W to a cassette C on the cassette stage 11 in such a manner that each of the N transport arms holds a single processed substrate W. In other words, the indexer robot 12 accomplishes simultaneous N-substrate transport in the indexer cell ID. While the substrates W are transferred collectively to and from the substrate transfer part 50, the substrates W are transferred on a one-by-one basis to and from a cassette C because of the spacing at which substrates are stored in the cassette C which is determined by standards.

The accomplishment of such simultaneous N-substrate transport reduces the number of operating steps of the indexer robot 12 for the entire lot to accordingly reduce the time required for the transport per substrate, as compared with the one-by-one transport of substrates W. This directly leads to improvement in throughput in the case where the throughput of the entire substrate processing apparatus 1 is determined by the substrate transport time in the indexer cell ID as in the above-mentioned preferred embodiments.

For the accomplishment of the simultaneous N-substrate transport, N sending substrate rest parts and N returning substrate rest parts in the substrate transfer part 50 are insufficient, but it is necessary to provide at least (N+1) sending substrate rest parts in the substrate transfer part 50. Preferably, at least (N+1) returning substrate rest parts is provided in the substrate transfer part 50. Thus, the substrate transfer part 50 in the substrate processing apparatus 1 according to the present invention includes at least (N+1) sending substrate rest parts for placing thereon unprocessed substrates W traveling from the cassette stage 11 toward the substrate transfer part 50. The substrate transfer part 50 further includes at least (N+1) returning substrate rest parts for placing thereon processed substrates W traveling from the substrate transfer part 50 toward the cassette stage 11. The spacing at which the sending substrate rest parts are arranged and the spacing at which the returning substrate rest parts are arranged in the substrate transfer part 50 are equal to the spacing at which the N transport arms of the indexer robot 12 are arranged.

This smoothly accomplishes the simultaneous N-substrate transport by the use of the indexer robot 12, to reduce the time required for the transport of substrates in the entire substrate processing apparatus 1. The greater the number of sending substrate rest parts and the number of returning substrate rest parts provided in the substrate transfer part 50 is, the more smoothly a plurality of steps of simultaneous N-substrate transport are accomplished in succession but the greater the space occupied by the substrate transfer part 50 is.

In the substrate transfer part 50, the at least (N+1) sending substrate rest parts are vertically stacked in a linear array. When there is an overlapping substrate rest part which is an overlap between the N of the at least (N+1) sending substrate rest parts as reckoned from the top end of the array and the N of the at least (N+1) sending substrate rest parts as reckoned from the bottom end of the array, the ID cell controller IDC controls the indexer robot 12 to load the substrate W to be processed earliest of the N unprocessed substrates subjected to the simultaneous N-substrate transport preferentially onto the overlapping substrate rest part. This always makes the overlapping substrate rest part preferentially vacant to smoothly accomplish a plurality of steps of simultaneous N-substrate transport in succession, thereby reducing the time required for the transport of substrates in the entire substrate processing apparatus 1.

When the above-mentioned overlapping substrate rest part is present and the indexer robot 12 transports a single unprocessed substrate W alone to the substrate transfer part 50 (non-simultaneous transport), the ID cell controller IDC controls the indexer robot 12 to load the single unprocessed substrate W onto other than the overlapping substrate rest part in the substrate transfer part 50. This leaves the overlapping substrate rest part vacant during the non-simultaneous transport to smoothly accomplish the subsequent step of simultaneous N-substrate transport, thereby reducing the time required for the transport of substrates in the entire substrate processing apparatus 1.

When there is no overlapping substrate rest part, the plurality of steps of simultaneous N-substrate transport can be accomplished smoothly in succession without effecting the transport control so as to make the overlapping substrate rest part vacant where possible.

6. Modifications

Although the preferred embodiments according to the present invention have been described hereinabove, various modifications in addition to the above may be made therein without departing from the spirit and scope of the present invention. For example, two or three transport arms are provided in the indexer robot 12 in the above-mentioned preferred embodiments, the number of transport arms may be N (where N is an integer not less than two). In this case, the substrate transfer part 50 is adapted to include at least (N+1) sending substrate rest parts. The number of returning substrate rest parts provided in the substrate transfer part 50 is preferably at least (N+1) from the viewpoint of reducing the time required for the transport of substrates in the entire substrate processing apparatus 1, but may be N.

The direction in which the substrate rest parts are arranged in the substrate transfer part 50 is not limited to the vertical direction, but may be a horizontal direction or an oblique direction. It is, however, necessary to cause the direction in which the substrate rest parts are arranged in the substrate transfer part 50 to coincide with the direction in which the transport arms of the indexer robot 12 are arranged. It is also necessary to make the spacing at which the substrate rest parts are arranged and the spacing at which the transport arms are arranged equal to each other.

The structure of the substrate processing apparatus 1 according to the present invention is not limited to that shown in FIG. 1. For example, the second cleaning processing cell SP2 is not an essential component when the substrate processing apparatus 1 performs only the front surface cleaning. The back surface cleaning process may be performed in the first cleaning processing cell SP1 whereas the front surface cleaning process be performed in the second cleaning processing cell SP2. Alternatively, each of the first cleaning processing cell SP1 and the second cleaning processing cell SP2 may include a front surface cleaning processing unit and a back surface cleaning processing unit. Further, an apparatus to which the technique according to the present invention is applied is not limited to the cleaning apparatus which performs scrub cleaning on a substrate, but may be an apparatus which performs other types of processes. The technique according to the present invention is especially effective for a substrate processing apparatus which has short cycle time between the transfer of a substrate W from the indexer cell ID and the return of the substrate W thereto.

While the invention has been described in detail, the foregoing description is in all aspects illustrative and not restrictive. It is understood that numerous other modifications and variations can be devised without departing from the scope of the invention.

What is claimed is:

1. A substrate processing apparatus for processing a plurality of substrates in succession, comprising:
    a substrate accumulation part for accumulating unprocessed substrates and processed substrates;
    a substrate processing part for performing a process on a substrate;
    a substrate transfer part used for transfer of a substrate between said substrate accumulation part and said substrate processing part;
    a first transport mechanism including N transport arms (where N is an integer not less than two) and for transporting a substrate between said substrate accumulation part and said substrate transfer part;
    a second transport mechanism for transporting a substrate between said substrate transfer part and said substrate processing part; and
    a transport controller for controlling said first transport mechanism to take an unprocessed substrate from said substrate accumulation part to transport the unprocessed substrate to said substrate transfer part, and to receive a processed substrate placed on said substrate transfer part to transport the processed substrate to said substrate accumulation part,
    said transport controller controlling said first transport mechanism so that said first transport mechanism simultaneously transports N unprocessed substrates from said substrate accumulation part and simultaneously loads the N unprocessed substrates into said substrate transfer part in such a manner that each of the N transport arms holds a single unprocessed substrate,
    said substrate transfer part including at least (N+1) sending substrate rest parts each for placing thereon an unprocessed substrate traveling from said substrate accumulation part toward said substrate processing part.

2. The substrate processing apparatus according to claim 1, wherein
    said transport controller controls said first transport mechanism so that said first transport mechanism simultaneously receives N processed substrates from said substrate transfer part and simultaneously transports the N processed substrates to said substrate accumulation part in such a manner that each of the N transport arms holds a single processed substrate, and
    said substrate transfer part includes at least (N+1) returning substrate rest parts each for placing thereon a processed substrate traveling from said substrate processing part toward said substrate accumulation part.

3. The substrate processing apparatus according to claim 2, wherein
    the number of said sending substrate rest parts is (N+1), and
    the number of said returning substrate rest parts is (N+1).

4. The substrate processing apparatus according to claim 1, wherein
    said at least (N+1) sending substrate rest parts are arranged in a single direction in an array, and
    when there is an overlapping substrate rest part which is an overlap between the N of said at least (N+1) sending substrate rest parts as reckoned from a first end of said array and the N of said at least (N+1) sending substrate rest parts as reckoned from a second end of said array, said transport controller controls said first transport mechanism so that said first transport mechanism which transports N unprocessed substrates loads the earliest one of the N unprocessed substrates to be processed preferentially onto the overlapping substrate rest part.

5. The substrate processing apparatus according to claim 4, wherein
    when said overlapping substrate rest part is present and said first transport mechanism transports a single unprocessed substrate alone, said transport controller controls said first transport mechanism to load the single unprocessed substrate onto other than said overlapping substrate rest part in said substrate transfer part.

6. The substrate processing apparatus according to claim 1, wherein
    said substrate processing part includes a cleaning processing part for performing a cleaning process on a substrate.

* * * * *